United States Patent [19]

Yamamoto et al.

[11] Patent Number: 4,592,062
[45] Date of Patent: May 27, 1986

[54] (VSIS) SEMICONDUCTOR LASER WITH REDUCED COMPRESSIVE STRESS

[75] Inventors: Saburo Yamamoto, Nara; Hiroshi Hayashi, Kyoto; Seiki Yano, Kashihara, all of Japan

[73] Assignee: Sharp Kabushiki Kaisha, Osaka, Japan

[21] Appl. No.: 498,041

[22] Filed: May 25, 1983

[30] Foreign Application Priority Data

May 25, 1982 [JP] Japan .................................. 57-89249

[51] Int. Cl.$^4$ ................................................ H01S 3/19
[52] U.S. Cl. ........................................ 372/48; 357/17; 372/36
[58] Field of Search ....................... 372/44, 45, 46, 48, 372/36; 357/17

[56] References Cited

PUBLICATIONS

Blum, "Double-Heterojunction Lasers with Double--Side Heat Sink Design", *IBM Technical Disclosure Bulletin*, vol. 15, No. 11, Apr. 1973, p. 3439.

*Primary Examiner*—James W. Davie
*Attorney, Agent, or Firm*—Birch, Stewart, Kolasch & Birch

[57] ABSTRACT

A V-channeled substrate inner stripe (VSIS) laser is manufactured on a GaAs substrate. The VSIS laser includes p-$Ga_{0.7}Al_{0.3}As$ active layer, and an n-$Ga_{0.85}Al_{0.15}As$ cap layer. The GaAs substrate is removed from the final device. The n-$Ga_{0.85}Al_{0.15}As$ cap layer functions to support the final device, and to minimize a stress applied to the p-$Ga_{0.7}Al_{0.3}As$ active layer.

4 Claims, 7 Drawing Figures

(VSIS) SEMICONDUCTOR LASER WITH REDUCED COMPRESSIVE STRESS

BACKGROUND AND SUMMARY OF THE INVENTION

The present invention relates to a semiconductor laser and, more particularly, to a V-channeled substrate inner stripe (VSIS) laser.

Recently, semiconductor lasers are used as light sources in an optical information processing systems utilizing devices such as optical video discs, optical audio discs, and laser printers. In such systems, the semiconductor laser must operate at a low threshold current, must emit a beam of a shorter wavelength with a stable transverse mode, and must enjoy a long operating life.

A V-channeled substrate inner stripe (VSIS) laser has been developed, which is suited to fulfill the above-mentioned requirements. However, the conventional VSIS laser can not show the satisfying operating life period because of a compressive stress applied to an active layer thereof.

Accordingly, an object of the present invention is to provide a V-channeled substrate inner stripe (VSIS) laser which stably operates at a shorter wavelength.

Another object of the present invention is to provide a semiconductor laser, wherein the compressive stress applied to an active layer is minimized.

Other objects and further scope of applicability of the present invention will become apparent from the detailed description given hereinafter. It should be understood, however, that the detailed description and specific examples, while indicating preferred embodiments of the invention, are given by way of illustration only, since various changes and modifications within the spirit and scope of the invention will become apparent to those skilled in the art from this detailed description.

To achieve the above objects, pursuant to an embodiment of the present invention, a GaAs layer is formed on a GaAs substrate. An n-GaAs current blocking layer, a p-GaAlAs cladding layer, a p-GaAlAs active layer, and an n-GaAlAs cladding layer are formed on the GaAs layer. An n-GaAlAs cap layer is formed on the n-GaAlAs cladding layer. The n-GaAlAs cap layer is thick enough so as to support the semiconductor laser. After formation of the n-GaAlAs cap layer, the GaAs substrate is removed through the use of an etching method.

The compressive stress applied to the active layer is mainly caused by the difference of the lattice constant between the GaAs substrate and the p-GaAlAs active layer at room temperature. When the GaAs substrate is removed, the compressive stress applied to the active layer is minimized.

In a preferred form, a GaAlAs etching stop layer is disposed between the GaAs substrate and the GaAs layer in order to ensure a stable etching of the GaAs substrate. After removing the GaAs substrate, the GaAlAs etching stop layer is removed by another etchant.

BRIEF DESCRIPTION OF THE DRAWINGS

The present invention will be better understood from the detailed description given hereinbelow and the accompanying drawings which are given by way of illustration only, and thus are not limitative of the present invention and wherein.

DESCRIPTION OF THE PREFERRED EMBODIMENTS

Figure 1:
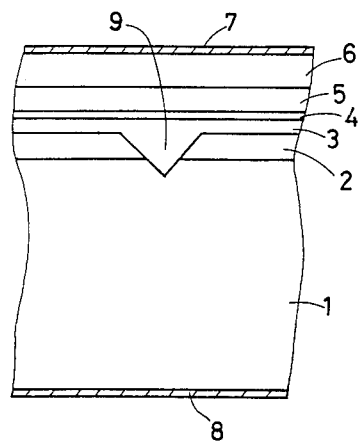
FIG. 1 is a sectional view showing a general construction of a V-channeled substrate inner stripe (VSIS) semiconductor laser.

FIG. 1 shows a general construction of a V-channeled substrate inner stripe (VSIS) semiconductor laser. An n-GaAs current blocking layer 2 is first formed on a p-GaAs substrate 1. A V-shaped groove 9, which functions as a current path, is formed in the n-GaAs current blocking layer 2 and extends to the p-GaAs substrate 1. A p-GaAlAs cladding layer 3, a GaAlAs active layer 4, an n-GaAlAs cladding layer 5, and an n-GaAs cap layer 6 are formed on the n-GaAs current blocking layer 2 as shown in FIG. 1. An n-electrode 7 is formed on the n-GaAs cap layer 6, and a p-electrode 8 is formed on the bottom surface of the p-GaAs substrate 1. The current flows only in the stripe region of the V-channel 9, and the beam existing outside of the V-channel 9 is absorbed by the n-GaAs current blocking layer 2.

Accordingly, the VSIS laser operates at a low threshold current, and exhibits the laser beam of a stable transverse mode. Furthermore, the VSIS laser is suited for the mass production because the fabrication steps thereof do not include a Zn diffusion step nor a pattern alignment step.

However, the above-mentioned conventional VSIS laser does not ensure a stable operation when the laser wavelength is shorter than 740 nm. This is because compressive stress is applied to the GaAlAs active layer 4, which shortens the operating period of the VSIS laser. More specifically, the lattice constant of the GaAs substrate is similar to the lattice constant of the respective grown layers at the growth temperature, about 800° C. However, the lattice constant of the respective layers and the lattice constant of the GaAs substrate differ from each other at room temperature, because the coefficient of thermal expansion of $Ga_{1-x}Al_xAs$ varies as the AlAs mole fraction (x) varies. Generally, the coefficient of thermal expansion of $Ga_{1-x}Al_xAs$ is expressed as follows:

$$(6.86 - 1.66x) \cdot 10^{-6} \, °C.^{-1}$$

That is, the lattice constant of the GaAs (x=0) substrate is different from the lattice constant of the $Ga_{0.7}Al_{0.3}As$ (x=0.3) active layer by about 0.06% at room temperature. The difference of the lattice constant creates the stress applied to the active layer 4 at room temperature. If the compressive stress applied to the active layer 4 is minimized, the operating life period of the VSIS laser may be lengthened.

In accordance with the present invention, the GaAs substrate 1, which creates the above-mentioned compressive stress, is removed through the use of an etching method. Instead, a cap layer having a desired AlAs mole fraction is formed to a thickness of 100 μm to support the laser device.

Figure 2:
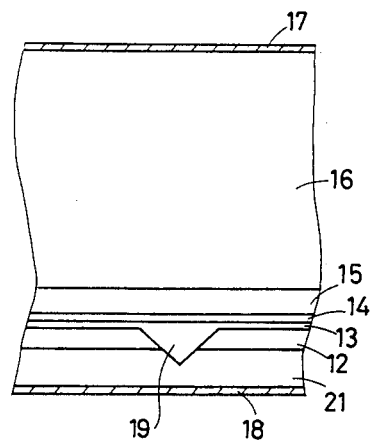
FIG. 2 is a sectional view of an embodiment of a V-channeled substrate inner stripe (VSIS) laser of the present invention.

FIG. 2 shows an embodiment of a V-channeled substrate inner stripe (VSIS) semiconductor laser of the present invention.

The VSIS laser of the present invention includes a p-GaAs layer 21, an n-GaAs current blocking layer 12, a p-GaAlAs cladding layer 13, a GaAlAs active layer 14, and an n-GaAlAs cladding layer 15. The p-GaAlAs cladding layer 13 and the n-GaAlAs cladding layer 15 define the active layer 14 by the hetero junctions formed between the active layer 14. An n-GaAlAs cap layer 16 is formed on the n-GaAlAs cladding layer 15 in order to achieve the ohmic contact. An n-electrode 17 is formed on the n-GaAlAs cap layer 16, and a p-electrode 18 is formed on the bottom surface of the p-GaAs layer 21 in order to apply the driving current to the GaAlAs active layer 14. A V-shaped groove (V-channel) 19 is formed in the n-GaAs current blocking layer 12. The p-GaAs layer 21, the n-GaAs current blocking layer 12, the p-GaAlAs cladding layer 13, the GaAlAs active layer 14, the n-GaAlAs cladding layer 15 and the n-GaAlAs cap layer 16 are formed through the use of an epitaxial method. The n-GaAlAs cap layer 16 has a thickness sufficient to support the semiconductor laser device.

FIGS. 3 through 7 show the fabrication steps of the VSIS laser of FIG. 2.

Figure 3:
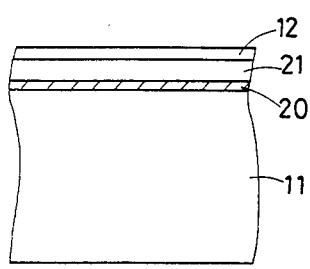
FIGS. 3 through 7 are sectional views showing fabrication steps of the VSIS laser of FIG. 2.

First, a GaAs substrate 11 is provided. An etching stop layer 20 ($Ga_{0.5}Al_{0.5}As$ layer of 1 $\mu m$ thick) is formed on the GaAs substrate 11 as shown in FIG. 3. The p-GaAs layer 21 of 2.0 $\mu m$ thick, and the n-GaAs current blocking layer 12 of 0.6 $\mu m$ thick are formed on the etching stop layer 20. The GaAs substrate 11 and the etching stop layer 20 will be removed by the end of the formation of the VSIS laser of the present invention and, therefore, the conductivity thereof is freely selected among the p-type, the n-type, and the undoped. However, the GaAs substrate 11 has, preferably, a low dislocation density.

Figure 4:
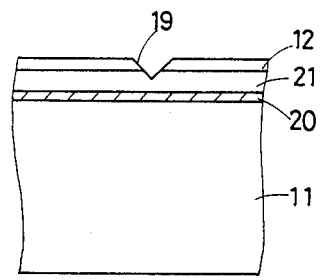

A V-shaped groove is formed in the n-GaAs current blocking layer 12 in the <110> direction to reach the p-GaAs layer 21 as shown in FIG. 4, thereby forming the V-channel 19.

Figure 5:
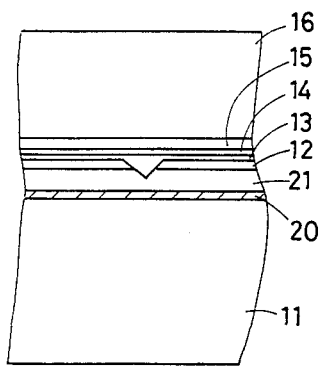

Then, the p-$Ga_{0.3}Al_{0.7}As$ cladding layer 13 of 0.1 $\mu m$ thick, the p-$Ga_{0.7}Al_{0.3}As$ active layer 14 of 0.1 $\mu m$ thick, the n-$Ga_{0.3}Al_{0.7}As$ cladding layer 15 of 1.0 $\mu m$, and the n-$Ga_{0.85}Al_{0.15}As$ cap layer 16 of 100 $\mu m$ thick are formed on the n-GaAs current blocking layer 12 as shown in FIG. 5 through the use of the epitaxial method.

Figure 6:
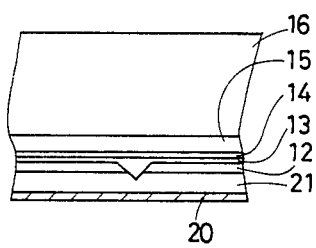

Thereafter, the GaAs substrate 11 is completely removed as shown in FIG. 6 through the use of an etchant made of oxygenated water and ammonia water ($H_2O_2:NH_4OH=5:1$). The etchant forms an oxide film on the GaAlAs layer so as to stop the etching operation at the $Ga_{0.5}Al_{0.5}As$ etching stop layer 20.

Figure 7:
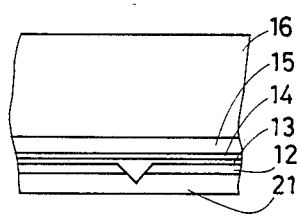

Then, the etching stop layer 20 is removed as shown in FIG. 7 through the use of an etchant made of hydrofluoric acid. That is, the GaAs substrate 11 and the etching stop layer 20 are completely removed before depositing the electrodes.

An electrode layer is formed on the n-$Ga_{0.85}Al_{0.15}As$ cap layer 16 by evaporating Au-Ge-Ni. Another electrode layer is formed on the bottom surface of the p-GaAs layer 21 by evaporating Au-Zn. The thus formed electrode layers are alloyed by the thermal treatment, thereby forming the n-electrode 17 and the p-electrode 18, respectively.

The thus constructed VSIS semiconductor laser exhibits the laser oscillation of the wavelength 690 nm at room temperature with the threshold current of 70 mA. The VSIS semiconductor laser of the present invention enjoys an operating life longer than 1000 hours under an output power of 3 mW.

In addition to the GaAlAs semiconductor laser, the present invention is applicable to other semiconductor laser of the three-component system or the four-component system which employs an InP substrate, a GaP substrate or an InAs substrate as the growing substrate.

In the foregoing embodiment, the etching stop layer 20 is employed to facilitate the etching operation. However, it may be possible to omit the etching stop layer 20 if the etching operation of the GaAs substrate 11 is properly controlled to reduce the thickness of the GaAs substrate from about 350 microns to several microns.

The invention being thus described, it will be obvious that the same may be varied in many ways. Such variations are not to be regarded as a departure from the spirit and scope of the invention, and all such modifications are intended to be included within the scope of the following claims.

What is claimed is:

1. In a V-channeled substrate inner stripe (VSIS) semiconductor laser, the improvement comprising:
   a first epitaxially grown layer (21);
   a second epitaxially grown layer (12) formed on said first epitaxially grown layer (21) with the intervention of a p-n junction formed between said first epitaxially grown layer (21) and said second epitaxially grown layer (12);
   a V-shaped groove formed in said second epitaxially grown layer (12) to a depth sufficient to reach said first epitaxially grown layer (21) through said p-n junction;
   a laser oscillation layer (13, 14, 15) formed on said second epitaxially grown layer (12), said laser oscillation layer (13, 14, 15) including an active layer (14) made of a compound of semiconductor material including at least three components;
   a supporting layer (16) formed on said laser oscillation layer (13, 14, 15), said supporting layer (16) being made of a compound of semiconductor material including said at least three components, wherein each component of the support layer has a composition ratio with respect to the associated component of the active layer suited for minimizing compressive stress applied to said active layer (14);
   a first electrode (17) formed on said supporting layer (16); and
   a second electrode (18) formed on the bottom surface of said first epitaxially grown layer (21).

2. The V-channeled substrate inner stripe (VSIS) semiconductor laser of claim 1, wherein:
   said active layer (14) is made of p-$Ga_{0.7}Al_{0.3}As$; and
   said supporting layer (16) is made of n-$Ga_{0.85}Al_{0.15}As$.

3. The V-channeled substrate inner stripe (VSIS) semiconductor laser of claim 2, wherein:
   said active layer (14) has a thickness of about 0.1 $\mu m$; and
   said supporting layer (16) has a thickness of about 100 $\mu m$.

4. In a V-channeled substrate inner stripe (VSIS) semiconductor laser the improvement comprising:

a first epitaxially grown layer of p-GaAs having a thickness of approximately 3 μm;

a second epitaxially grown layer formed on said first epitaxially grown layer with the intervention of a p-n junction formed between said first epitaxially grown layer and said second epitaxially grown layer;

a V-shaped groove formed in said second epitaxially grown layer having a depth sufficient to reach said first epitaxially grown layer through said p-n junction;

a laser oscillation layer formed on said second epitaxially grown layer, said laser oscillation layer including an active layer of $P-Ga_{0.7}Al_{0.3}As$ having a thickness of approximately 0.1 μm;

a supporting layer formed on said laser oscillation layer, said supporting layer being made of $n-Ga_{0.5}Al_{0.5}As$ having a thickness of 100 μm;

a first electrode formed on said supporting layer; and a second electrode formed on the bottom surface of said first epitaxially grown layer.

* * * * *